US012153106B2

(12) United States Patent
Case, Jr.

(10) Patent No.: US 12,153,106 B2
(45) Date of Patent: Nov. 26, 2024

(54) PORTABLE MAGNETIC RESONANCE IMAGER

(71) Applicant: MicroTesla Systems, Inc., Winter Garden, FL (US)

(72) Inventor: Russell L. Case, Jr., Oviedo, FL (US)

(73) Assignee: Microtesla Systems, Inc., Winter Garden, FL (US)

( * ) Notice: Subject to any disclaimer, the term of this patent is extended or adjusted under 35 U.S.C. 154(b) by 0 days.

(21) Appl. No.: 18/020,142

(22) PCT Filed: Sep. 23, 2022

(86) PCT No.: PCT/US2022/044495
§ 371 (c)(1),
(2) Date: Feb. 7, 2023

(87) PCT Pub. No.: WO2023/049320
PCT Pub. Date: Mar. 30, 2023

(65) Prior Publication Data
US 2024/0302461 A1 Sep. 12, 2024

Related U.S. Application Data

(60) Provisional application No. 63/248,090, filed on Sep. 24, 2021.

(51) Int. Cl.
*G01R 33/32* (2006.01)
*G01R 33/34* (2006.01)

(52) U.S. Cl.
CPC ..... *G01R 33/323* (2013.01); *G01R 33/34069* (2013.01)

(58) Field of Classification Search
CPC ................. G01R 33/323; G01R 33/34069
See application file for complete search history.

(56) References Cited

U.S. PATENT DOCUMENTS

| 3,886,440 | A | 5/1975 | Berry |
| 5,390,673 | A | 2/1995 | Kikinis |
| 7,573,264 | B2 | 8/2009 | Xu et al. |
| 11,226,381 | B2 * | 1/2022 | Bert ................... G01R 33/0047 |

(Continued)

FOREIGN PATENT DOCUMENTS

WO    2012159896 A1    11/2012

OTHER PUBLICATIONS

Jin, J. (1999), Electromagnetic analysis and design in magnetic resonance imaging (p. 22). Boca Raton, FL: CRC (Abstract).

(Continued)

*Primary Examiner* — Gregory H Curran
(74) *Attorney, Agent, or Firm* — Terry M. Sanks, Esq.; Beusse Sanks, PLLC

(57) ABSTRACT

A portable magnetic resonance imager has a probe. One or more magnets are disposed in the probe, creating at least one magnetic field to precess protons at a target. A magnetometer disposed in the probe has a light source and a nitrogen vacancy diamond. The light source projects a light on the nitrogen vacancy diamond. The nitrogen vacancy diamond fluoresces in response to the light. A photodetector detects the fluorescence and produces a signal in response thereto indicative of the decaying of precessing protons having precessed in the presence of the one or more magnets.

13 Claims, 21 Drawing Sheets

(56) References Cited

U.S. PATENT DOCUMENTS

| 11,678,826 B2* | 6/2023 | Ma .......................... A61B 5/243 |
| | | 600/407 |
| 11,988,729 B2* | 5/2024 | Mizuochi ............... G01R 33/26 |
| 2007/0032747 A1 | 2/2007 | Hashimshony et al. |
| 2010/0308813 A1 | 12/2010 | Lukin et al. |
| 2016/0223621 A1 | 8/2016 | Kaup et al. |
| 2018/0284204 A1 | 10/2018 | Levy |

OTHER PUBLICATIONS

International Search Report and Written Opinion—PCT/US2022/044495. Issue Dec. 19, 2022.

Grosz, A., Ed. (2017). High Sensitivity Magnetometers (p. 553 556, 559, 562). Switzerland: Springer International Publishing.

Doherty, M.W., Manson, N.B., Delaney, P., Jelezko, F., Wrachtrup, J., & Hollenberg, L.C.L. (2013). The nitrogen-vacancy colour center in diamond. arXiv:1302.3288 vol. 528, Issue 1 pp. 1-45.

* cited by examiner

PORTABLE MAGNETIC RESONANCE IMAGER

CROSS-REFERENCE TO RELATED APPLICATION

This application claims the benefit of International Application No. PCT/US2022/044495 filed Sep. 23, 2022, which claims the benefit of U.S. Provisional Patent Application Ser. No. 63/248,090, filed Sep. 24, 2021, the entireties of which are incorporated by reference herein as if fully set forth.

BACKGROUND OF THE INVENTION

The present invention is directed to a portable Magnetic Resonance Imager (pMRI) and more particularly a pMRI utilizing Nitrogen Vacancy Diamond (NVD) as the magnetic sensor as well as a novel magnet configuration designed to produce a useful magnetic field outside the physical constraints of the magnet, to produce images representing the arrangement and concentration of hydrogen protons, or other magnetic resonance structures, in humans, animals, and any other substance.

In order to understand the present invention, some background information about the need for a small, portable, low-field, MRI is helpful.

1.1 Problem

Traditional Magnetic Resonance Imaging (MRI) visualizes anatomical structure and functions non-invasively with high spatial and temporal resolution. Yet, to overcome the low sensitivity inherent in inductive detection of weakly polarized nuclear spins, clinical MRI scanners employ cryogenically-cooled superconducting magnets producing very high magnetic fields. Commonly found at 1.5-7 Tesla (T), these powerful magnets are massive, and have very strict infrastructure demands that preclude operation in many environments. MRI scanners are costly to purchase, site, and maintain.

MRI scanners are built around massive superconducting magnets, and the total installed cost of MRI systems is typically $1 M per tesla of magnetic field. The high cost of these devices limits the number of scanners on site, and it requires medical facilities to carefully prioritize patients. Additionally, these massive scanners preclude mobile operation, and preclude many locations including surgical suites, triage and primary care suites.

Operation at low magnetic fields would enable imaging in environments where high magnetic fields would be contraindicated (such as in the presence of nearby ferrous materials) and would raise the potential for scanners to be built and installed at significantly reduced total installed cost. Low magnetic fields would also enable open geometry designs that would ease patient handling and positioning.

1.2 Nitrogen Vacancy Diamond Magnetometers

Within the past few years, magnetometers using nitrogen-vacancy color centers in diamond, have been considered for a wide range of applications because of their high spatial resolution, simplicity of use, but most importantly for pMRI, is their application at room temperature. See Grosz, A., Haji-Sheikh, M. J., Mukhopadhyay, S. C. (2017). *High Sensitivity Magnetometers* (p 553). Switzerland: Springer International Publishing.

As seen in FIG. 1, the NVD 148 consists of a normal tetrahedral diamond lattice with one carbon atom substituted with a nitrogen atom and a vacancy adjacent to the nitrogen atom, as shown in the figure. Because of the tetrahedral shape of the crystal lattice, there are four possible orientations of the nitrogen-vacancy axis. The axis is defined as the line connecting the nitrogen atom with the vacancy.

Each NV center, due to the dangling electrons from the three adjacent carbon atoms and the nitrogen atom, has an electronic energy level ground state, $^3A_2$, and an excited state, $^3E$. The optical transition between these states is a 637 nm wavelength. Energy from a 532 nm green laser raises the energy level of the electrons from the ground state to the excited state, and fluorescence decay from the excited state to the ground state emits light in the 637 nm to 800 nm wavelength range. There are energy sublevels that are dependent on the magnitude of the magnetic field coupled to the NV center due to the Zeeman effect. This effect is linearly dependent on the magnitude of the field. Given that there are four possible orientations of the NV center, it is possible to measure the effects of the magnetic field contribution along each axis and derive directionality of the source of the magnetic field as well as magnitude.

Because the difference in the energy sublevels is within the range of microwaves, it is possible to apply a microwave signal that resonates with the one of the transitions. When this happens the fluorescence is spoiled, causing the intensity at that frequency to decrease. Combining these effects, one can measure the magnetic field intensity based on the magnitudes of the fluorescence and the direction can be derived from the frequency deviation.

Because the sensitivity of NVD is within the realm of the most sensitive magnetometers (SQUIDs, Vapor Cells, AMS), but does not require the supporting cryogenics and is much smaller than the Faraday Induction Coils, it is the perfect magnetometer for pMRI.

1.2.1 Fundamental Parameters 1.2.1.1 Proton Density

Proton density refers to the number of protons in a unit volume that are available for MR measurement. See Liang, Z., Lauterbur, P. C., (2000). Principals of magnetic resonance imaging (pp. 66-67). New York: Institute of Electrical and Electronics Engineers, Inc. Since only two spin states are available for hydrogen, the hydrogen nucleus (proton) will line up with the external magnetic field either parallel or anti-parallel to the direction of the external magnetic field.

However, the parallel spin quanta is the lower of the two energy levels. This means that there are approximately 10 extra protons precessing parallel to the external magnetic field for every million protons than anti-parallel. This exceedingly small number is offset by the fact that there are Avogadro numbers ($6.022 \times 10^{23}$) of protons in the volume being measured. Using a volume element (voxel) equivalent to medical MRIs of 0.125 cubic-mm, there are approximately $8.34 \times 10^{18}$ protons in a voxel. Thus there are approximately $8.52 \times 10^{14}$ hydrogen atoms that can be measured. See Case, R. L. (2008). *Reducing eddy currents in high magnetic field environments* (pp. 20-21). Master's thesis, University of Central Florida, Orlando.

This spin density gives weight to the voxel in the form of intensity of the image. For positive image depiction (white=high density), tissue (or other object) will show up white for high proton density and black for samples with no protons that can be measured.

1.2.1.2 Larmor Frequency

To create a useful image of the human body, modern medical MRIs rely on the interaction of nuclear spin with a high magnitude external magnetic field, $B_0$. The interaction of a spinning proton (hydrogen nucleus) and an external magnetic field results in the precession of The proton spin about the axis of the external magnetic field. In essence the majority of the proton spins "line up" with the external magnetic field. The frequency, $\omega_0$, of the precession is:

$$\omega_0 = \gamma B_0$$

where $\gamma$ is a fundamental constant called the gyromagnetic ratio. For protons $\gamma$ has the value $2.68 \times 10^8$ radians/second/Tesla or 42.6 MHz/T. This precession frequency is called the Larmor frequency. See Hacke, E. M., Brown, R. W., Thompson, M. R., & Venkatesan, R. (1999), *Magnetic resonance imaging: Physical principals and sequence design* (p. 4). New York: A John Wiley & Sons, Inc. For most medical MRIs the bore field is either 1.5T or 3.0T and the resulting precession frequency is either 63.9 MHz or 127.8 MHz. High magnetic field strength is used in stationary fixed-site MRIs because it provides an inherently greater signal-to-noise ratio.

Most clinical electromagnets use Niobium-Titanium (NbTi) or other superconducting materials surrounded by copper, forming a large coil. The coil is integrated with additional superconducting coils that are active electromagnetic shielding. Additional passive shielding is also used. The superconducting coils are then surrounded by layers of vacuum insulation, liquid helium that causes the NbTi coils to enter the superconducting phase, and then liquid nitrogen to reduce vaporization of the very expensive liquid helium. See Bushong, S. C. (1996). *Magnetic resonance imaging: physical and biological principals* (p. 140). St. Louis, MO: Mosby-Year Book, Inc. The copper coating allows for superconducting "quench" in case of power failure or loss of superconductivity in the "ramp down" of the magnet.

However, lower field strength, such as that used in pMRI, is advantageous for its smaller size, lower weight, decreased complexity, and many other considerations.

1.2.1.3 Relaxation Times

In order to line up with an applied external magnetic field, a precessing proton will give up energy to the surrounding lattice of nearby atoms in the form of thermal energy. The rate at which this occurs gives rise to the longitudinal magnetization of the sample, and that time constant is called $T_1$ or "spin-lattice relaxation time." To set up the measurement of $T_1$, the precessing protons are "perturbed" into the transverse (perpendicular to the $B_0$ field) axis or into the anti-parallel (180 degree shift) with an RF pulse. This RF pulse simultaneously causes the precessions to achieve the same phase organization.

Another important parameter used in MRI is called the "spin-spin relaxation time" or $T_2$, which is a measure of the rate at which the phase relationship of protons decay as the proton precessions line up with the bore field (parallel to the bore field). Since there are always localized variations in the magnetic field, which result in variations in the Larmor frequency, each individual spin is exposed to a different field strength which leads to the loss of coherence.

The proton spin density, relaxation times, and to lesser degrees the magnetic susceptibility and chemical shift parameters are used to construct the familiar MRI images.

SUMMARY OF THE INVENTION

This Summary is provided to introduce a selection of concepts in simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

A portable magnetic resonance imager has a probe. One or more magnets are disposed in the probe, creating at least one magnetic field to precess protons at a target. A magnetometer disposed in the probe has a light source and a nitrogen vacancy diamond. The light source projects a light on the nitrogen vacancy diamond. The nitrogen vacancy diamond fluoresces in response to the light. A photodetector detects the fluorescence and produces a signal in response thereto indicative of the decaying of precessing protons having precessed in the presence of the one or more magnets.

These and other embodiments, features, aspects, and advantages of the invention will become better understood with regard to the following description, appended claims and accompanying drawings.

BRIEF DESCRIPTION OF THE DRAWINGS

In order to facilitate a more robust understanding of the application, reference is now made to the accompanying drawings, in which like elements are referenced with like numerals. These drawings should not be construed to limit the application and are intended only to be illustrative. The foregoing aspects and the attendant advantages of the present invention will become more readily appreciated by reference to the following detailed description, when taken in conjunction with the following accompanying drawings.

Reference symbols or names are used in the figures to indicate certain components, aspects or features shown therein. Reference symbols common to more than one figure indicate like components, aspects or features shown therein.

2.0 Detailed Description of the Preferred Embodiments 2.1 Portable Magnetic Resonance Imager Disclosed is a Portable Magnetic Resonance Imager (pMRI). A brief description of the functions blocks is followed by a more detailed description.

Two magnet systems work together to form the useful magnetic field designed to align proton precessions. In order to supplement the nonhomogeneous external-field electromagnet, a set of permanent magnets are disclosed. These permanent magnets are designed such that the produced magnetic field aligns with the main field produced by the nonhomogeneous electromagnet.

The nonhomogeneous external-field electromagnet then produces an aligned magnetic field as well as gradient fields to produce a spatial distinction among the measured precessing protons. This external field extends beyond the physical extents of the magnet, and is enclosed in a hand-held probe that allows the user to direct the useful field to any biological or other object for which precessing protons are to be measured.

Figure 1:
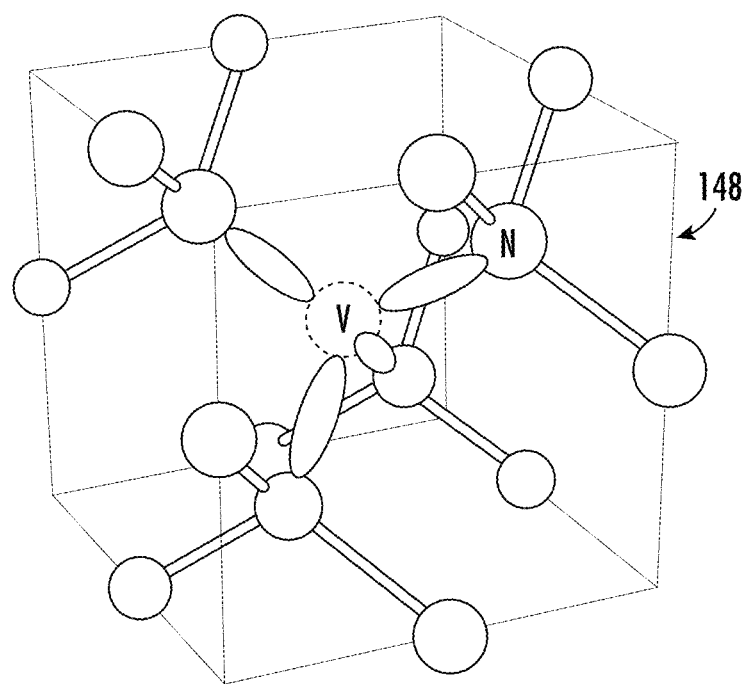
FIG. 1 is a representation of an NVD crystal cell as known in the art.
Figure 2:
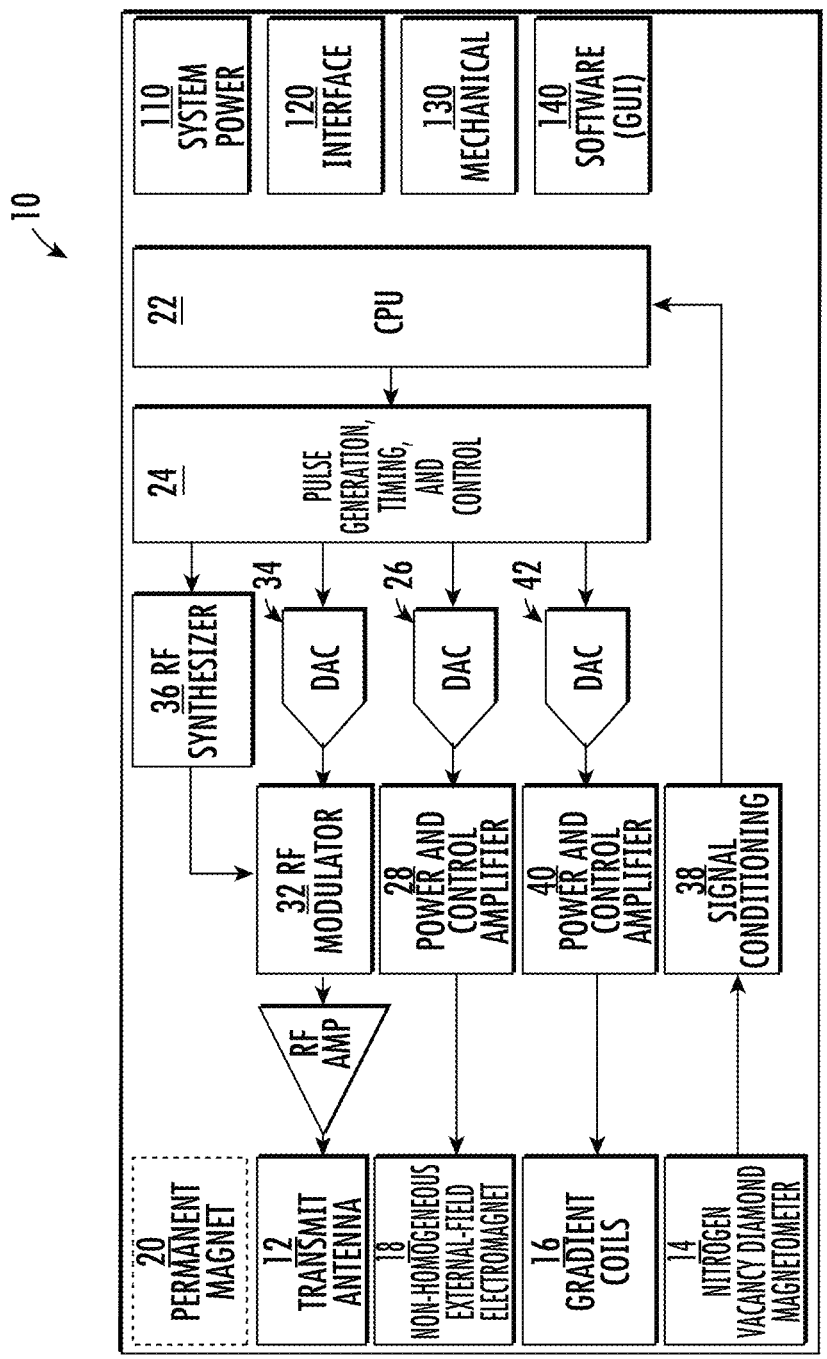
FIG. 2 shows a block diagram of a portable MRI system constructed in accordance with the invention.

Reference is now made to FIG. 2 in which a block diagram of the pMRI, generally indicated as 10, and constructed in accordance with the invention is provided. As known in the art pMRI 10 includes a power source 110, an interface 120, a mechanical structure 130 and a Graphical User Interface 140 as generally known in the art, unless otherwise described below, for operating pMRI 10.

A CPU 22 provides feedback based control of the sensor components of pMRI 10. Specifically, CPU 22 provides control inputs to a pulse generation, timing and control unit 24 which in turn provides control outputs magnets 16, 18, 20 and a magnetometer 14 as described below in more detail. Control signals are produced by control unit 24 and processed by an RF modulator 32 and RF synthesizer for modulating the direct input to RF modulator to drive a transmit antenna 12.

At the same time control unit 24 provides inputs to power and control amplifiers 28, 40 for operating non homogeneous external field electromagnet 18 and gradient coils 16 respectively. The control signals produced by control unit 24 are shaped by respective digital to analog converters (DAC) 26, 34, 42 prior to being operated upon. It is known in the art that a single DAC may be used for operation upon each of the outputs of control unit 24.

A magnetometer 14, including a nitrogen vacancy diamond, monitors for the magnetic field at a target object, having been subject to the magnetic fields of magnets 16, 18, 20. Magnetometer 14 also operates under the control of control unit 24 and provides a signal corresponding to the measured magnetic field at the target and provides an input, conditioned by signal conditioning unit 38, as feedback to CPU 22.

Transmit antenna 12 in the form of a coil, in a preferred non limiting embodiment, is powered by RF amplifier 30, and perturbs the precessing protons in a target by adding energy to the proton spin system to increase the precession angle, increase the anti-parallel population, and synchronize the phase relationship of the precessing protons.

The Nitrogen Vacancy Diamond (NVD) magnetometer 14 then measures the magnetic field in spatial as well as temporal coordinates as the precession protons de-phase and return to a lower energy state small-angle precession. Further, modulation of the magnetic field under the control of control unit 24, and in turn magnets 16-20, allows the precession vector to alternately randomize and align. The measurement of directionality and intensity of the measured magnetic signature of each voxel allows a reconstruction of the data to form an image representative of the structure and type of biological tissue or other magnetic resonant substance being measured.

All of the functionality is managed and controlled by appropriately selected microprocessors and operating software in CPU 22. Functionality is selected by the user through hard and soft controls and indicators as well as displays of the data in a manner useful to the diagnosis of the data.

Power is supplied by system power 110 and may include by nonlimiting example, universal sources including 120 VAC, 60 Hz sources typically found in the Western hemisphere, 220 VAC, 50 Hz sources typically found in Eastern hemisphere, and all manner of remote, battery, solar, and other energy sources.

Figure 3:
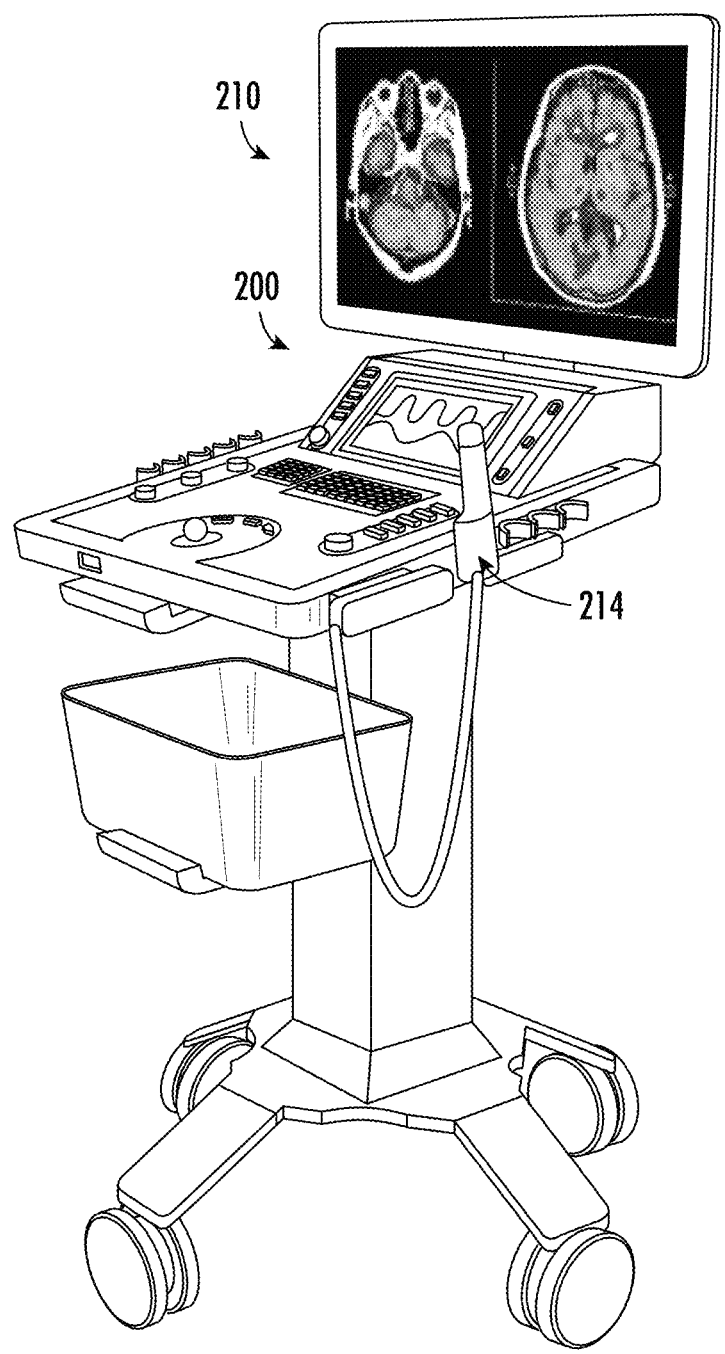
FIG. 3 is a top perspective view of a portable magnetic resonance imager constructed in accordance with one embodiment of the invention.

The pMRI 100 is housed and supported by appropriate relocatable stands 200 with facilities for mounting of the electronics, GUI displays 210, controls, indictors, and the probe 214. A notional depiction of a pMRI housing is shown in FIG. 3.

The display section 210, including GUI interface of the pMRI 10 is a high definition full color, high refresh rate (to support full motion video imaging).

The novel and unique probe 214 contains the magnetic system (including magnets 16-20) for producing the useful magnetic field as well as the NVD magnetometer sensor 14. A notional depiction of the pMRI display 210 and probe 214 are shown in the figure.

1.2.2 Magnet System

Useful magnetic fields are produced in only two ways: through the use of magnetic materials (permanent magnets)

and passing current through a conductor (electromagnets). The shape of the magnetic field depends entirely on the physical arrangement of magnetic material or the path of the conductor.

A number of well-known shapes occur for permanent magnets: the bar (round or square cross section), and the horseshoe (a bar bent around on itself). The most common form of electromagnet is the solenoid. Variations of permanent magnets occur to form other useful configurations, such as the fields in electric motors. Coils of wire are formed in a wide variety of forms for specific purposes, such as armature windings, coils for beam forming in television, radar, antennas, and of course, prior art MRI equipment.

Knowledge of the basic concepts of the field structure for various configurations of permanent magnet and wire forms leads the inventor to conceptually devise a potentially advantageous magnetic field configuration. Superposition of more than one arrangement of coil and magnet can lead to ever more complex field configurations. The goal of the acceptable field configuration is sufficient strength to align the hydrogen atoms, yet sufficient gradient to allow discrimination of the hydrogen density at the spatial coordinates under investigation to be discerned from surrounding coordinates.

Homogeneity is necessary, in a typical MRI, to differentiate between certain tissue types and to capture spatial information-"where in space the signal is coming from." All of this becomes much less important as long as the value of the $B_0$ field is known. If so, as long as no two points in the space being measured are the same, spatial information is preserved. As long as the absolute $B_0$ field is known, any differences in tissue can be calculated out. For example, the resonances created by fat and water are only 3.5 ppm. So, as long as $B_0$ is known within that tolerance, tissues can be distinguished.

A very fast two-dimensional pure phase encoding technique, similar to the CPMG sequence, can be used on highly inhomogeneous fields and reduces the acquisition time by at least two orders of magnitude.

1.2.2.1 Solenoid

Figure 4:
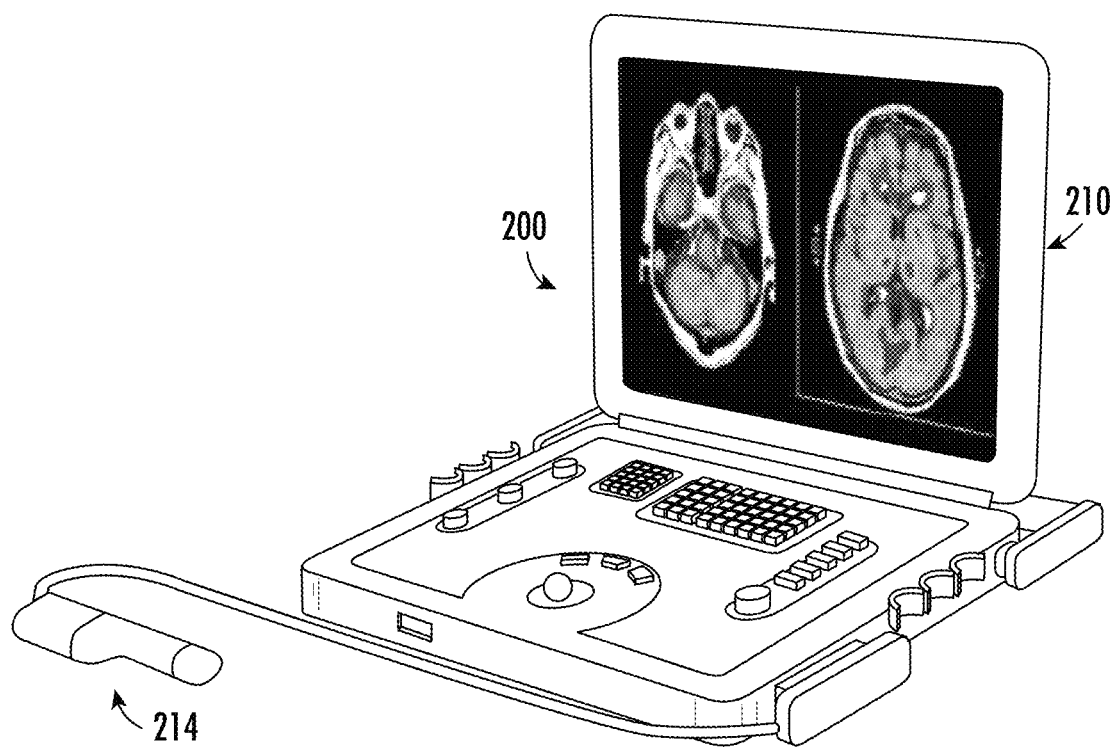
FIG. 4 is a top perspective view of a portable magnetic resonance imager display constructed in accordance with one embodiment of the invention.
Figure 5:
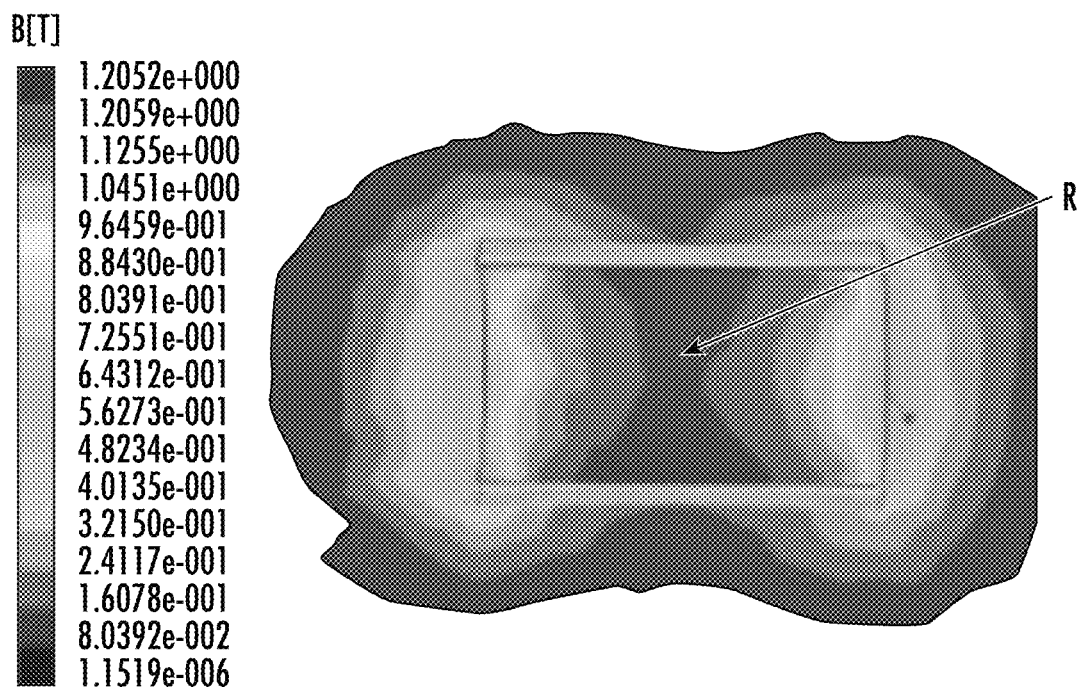
FIG. 5 shows a solenoid field plot, according to an aspect of this disclosure.

As shown in FIG. 4, an example of a simple solenoid for one exemplary embodiment of the bore coil, is provided. Specialized forms of this are used for typical MRIs, where the internal magnetic field (red, see FIGS. 5,6) is generated to maximize the proton alignment for the largest signal to noise ratio. However, the portion of the field deemed useful is contained completely within the physical confines of the magnet.

In medical MRI systems, the concentration lies in the "red" areas R where the field is strongest and, with the help of shim coils and gradient coils, the field strength is very uniform across a specific volume. In this application, our interest lies in the fact that the field is not uniform (natural gradient), and although not as strong as the central volume, is sufficiently strong for imaging purposes. Additional coil structures focus on making the external field linear or well defined for useful imaging purposes. The field does not have to be linear-just well known. Image processing techniques can further discern specific locations within the volume of interest.

1.2.2.2 Multi-Solenoid

The Multi-Solenoid design is modeled to investigate the supposition that the near field linearization occurs with stacked coil configurations. Additionally, field strength is increased representing the ability to create stronger signals by increased hydrogen spin populations. A representative multi-solenoid design is shown in the next figure.

Figure 6:
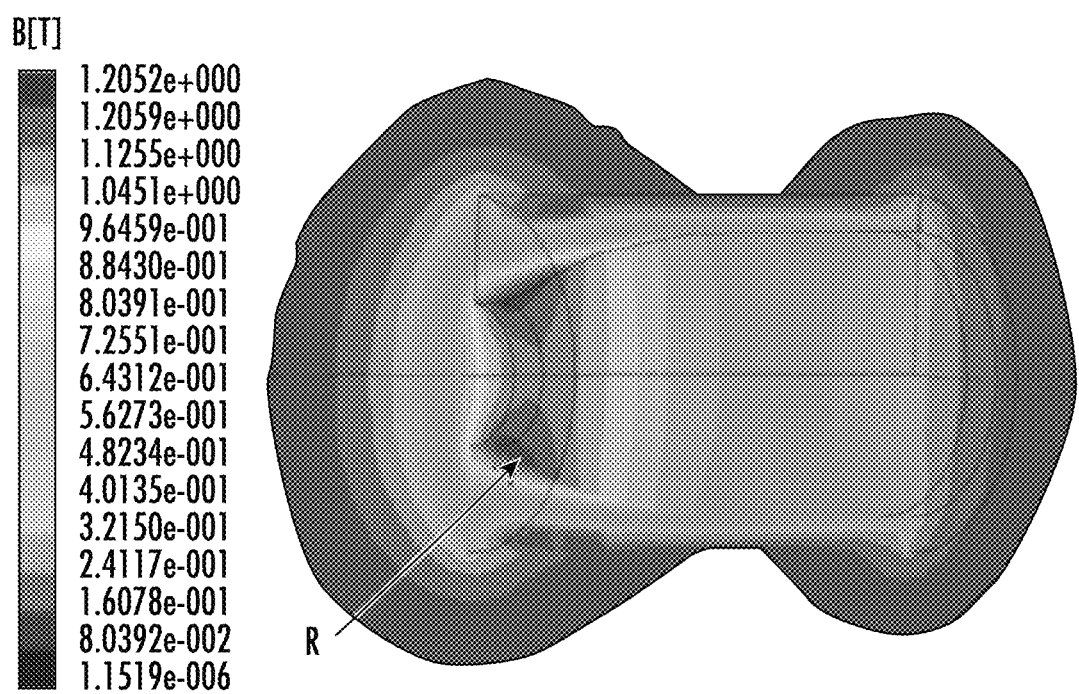
FIG. 6 shows a multi-solenoid field plot, according to an aspect of this disclosure.

The "red" section R of the bore field is moved to one end of the magnet (FIG. 6). However, it is not this portion of the field that is useful. Rather, the green and yellow portion extending beyond the physical limits of the magnet are of interest.

1.2.2.3 Golay Coil

The Golay coil is a pair of saddle shaped coils 702, 704 designed to create a gradient in the vicinity of the curved sections. Each linear section cancels out the field of its neighbor due to symmetry. The model is shown in FIG. 7.

Figure 7:
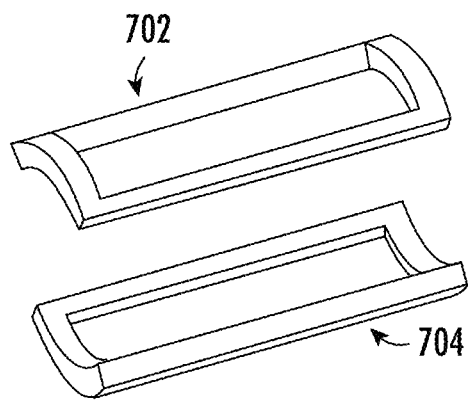
FIG. 7 is a perspective view of Golay coils, according to an aspect of this disclosure.

In the model shown in FIG. 7, each coil passes a current in such a manner that the upper coil 702 adds to the field strength in the region of interest, and the lower coil 704 subtracts or weakens the field in the region of interest.

By the right-hand rule, current flows in the positive x-axis direction in the section located closest to the origin. This direction of current flow causes current to flow towards the negative x-axis in the curved section of the upper coil furthest away from the origin. Thus, the magnetic field points towards the positive z-axis.

Current flowing in the opposite manner in the lower coil causes its magnetic field to point in the negative z-axis and by superposition of fields, will subtract from a magnetic field pointing towards the positive z-axis.

Figure 8:
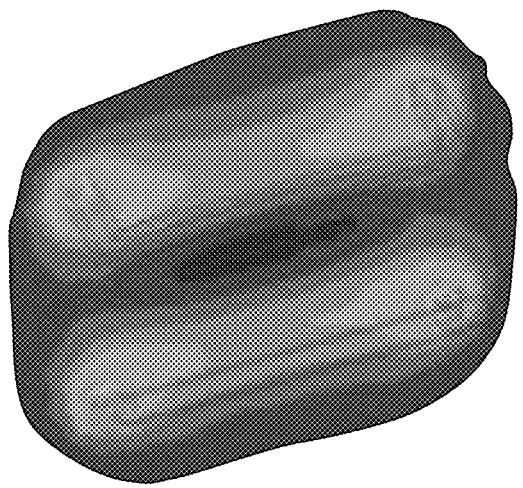
FIG. 8 is a field plot of the Golay coils, according to an aspect of this disclosure.

A field plot of the Golay coils, as seen in FIG. 8, Indicates the field intensity with gradually diminishing magnitude as the distance from the curved section increases. What is not shown is the direction of the field. The direction becomes apparent as the Golay Coil field is superimposed with the solenoid.

Figure 9:
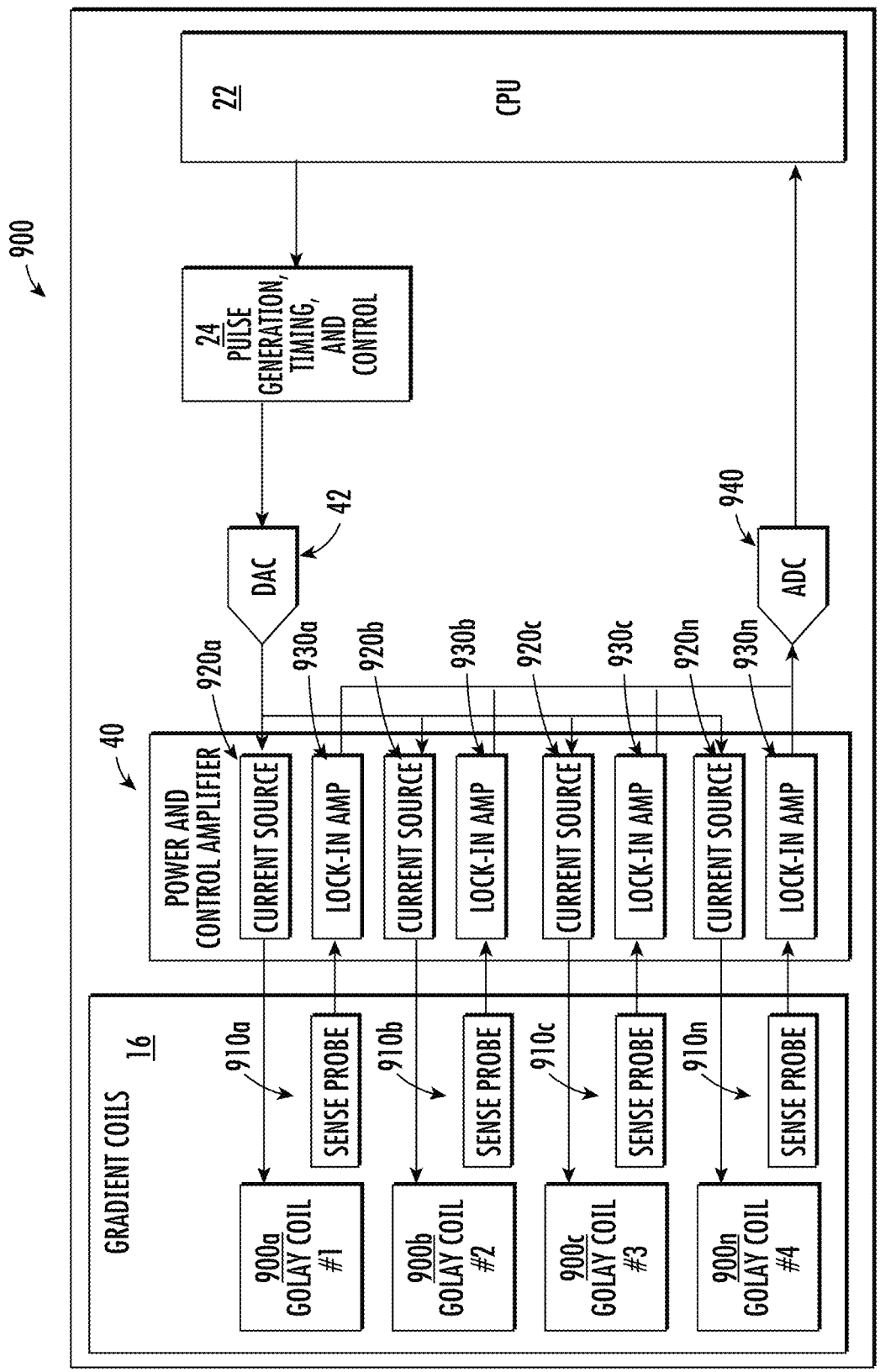
FIG. 9 is a block diagram of the pMRI magnet control system in accordance with one embodiment of the invention.

FIG. 9, shows a block diagram of a preferred nonlimiting embodiment of the pMRI magnet control system, generally indicated as 900 of pMRI 10. Magnet control system 900, as indicated above includes CPU 22 providing control signals to control unit 24. Control unit 24 in turn provides control signals to power and control amplifier 40, which in turn provides signals for controlling operation of gradient coil 16.

Gradient coil 16 actually includes a plurality of Golay coils 900a-900n. A respective sensor probe 910a-910n is associated with a respective Golay coil 900a-900n. Power control amplifier 40 includes one or more current sources 920a-920n associated with a respective Golay coil 900a-900n for providing current to activate each respective one of gradient coils 16. A respective lock in amplifier 930a-930n of power and control amplifier 40 receives the signals from respective sensor probes 910a-910n, amplifies the signal and inputs the signal as a feedback, via an analog to digital converter 940, to CPU 22.

Each Golay coil 900a-900d is driven by a respective computer controlled current source 920a-920n and individually sensed by sensors 910a-910n to provide feedback to the computer (CPU 22) for precision control and manipulation of the magnetic field gradients by CPU 22.

1.2.2.4 Nonhomogeneous Bore Magnet

There are a number of reasons for having a homogeneous field, such as minimizing adverse interactions of proton spins with its surroundings. For clinical applications, a magnetic field that varies by just a few parts per million over a spherical volume of 50 cm is typical. See Jin, J. (1999), *Electromagnetic analysis and design in magnetic resonance imaging* (p. 22). Boca Raton, FL: CRC While a number of coil configurations are capable of producing a homogeneous magnetic field, a purpose-designed set of Helmholtz coils (co-axially arranged solenoids as described above) is best suited for medical MRI. However, in all electromagnet designs capable of producing homogeneous fields, the useful field is inside the physical constraints of the magnet.

Despite the desire to maintain a homogeneous magnetic field, if the magnetic field was perfectly uniform across the entire sample, the Larmor frequency would be the same for all points in the sample and it would be impossible to determine spatial differences within the sample. To create spatial differences in Larmor frequencies, and thus an image, x, y, and z gradient fields are purposefully imposed on the bore field, which violates the desire to maintain a homogenous field. Yet, we are still able to obtain a useful image.

Figure 10:
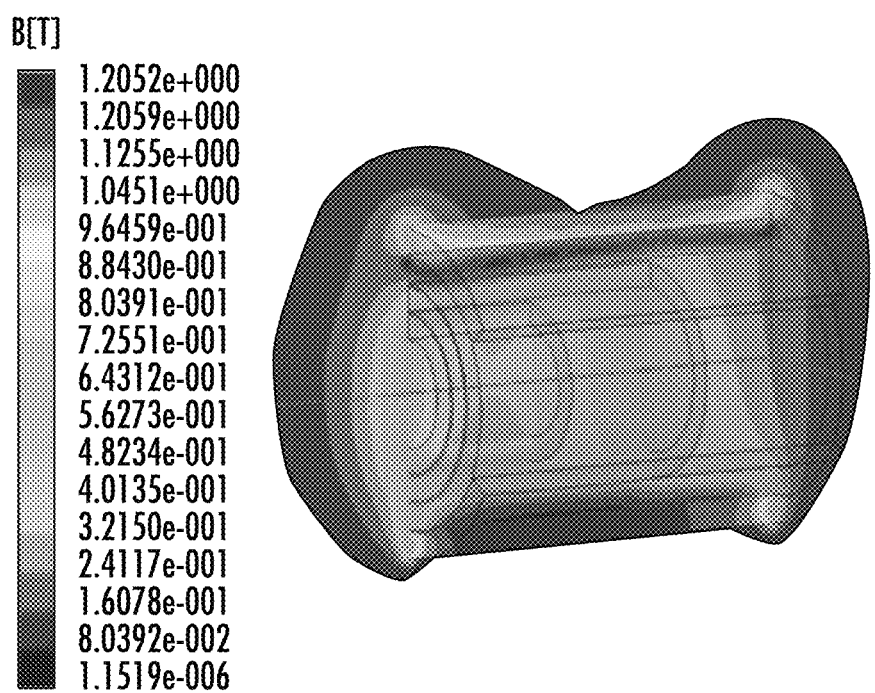
FIG. 10 is depicts the shifted bore field of a magnet in accordance with the invention.

FIG. 10 shows a one-dimensional aspect of the invention, where the bore field is simultaneously shifted to produce a useful magnetic field outside the physical extents of the magnet, and the Golay coils shift the slope of the magnetic field in order to produce a gradient that creates a spatial differential in the field so that specific Larmor frequencies can be measured that represent the concentration of precessing protons in the volume of interest.

Figure 11:
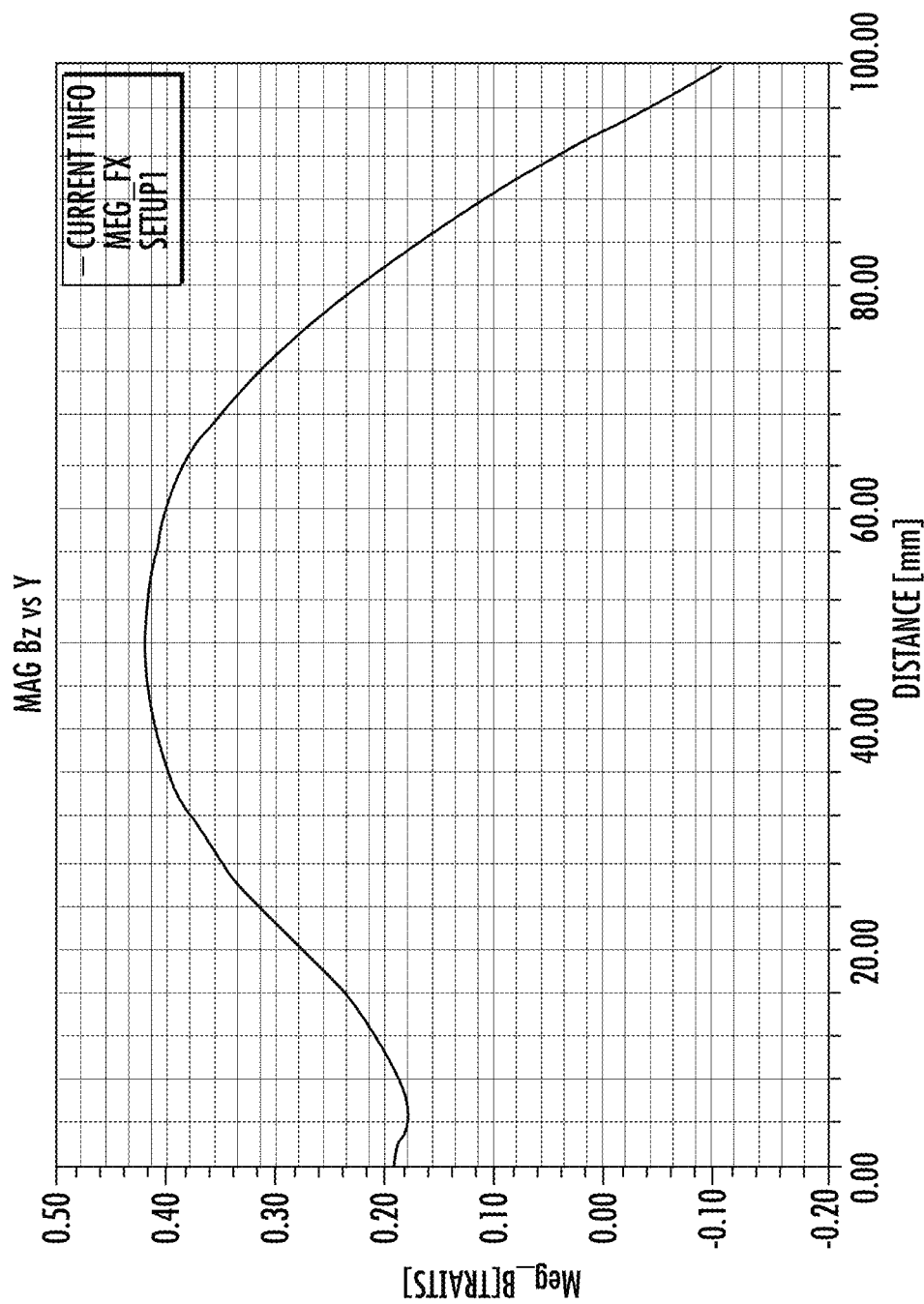
FIG. 11 a graph of the field strength as a function of distance along the Y axis of the bore magnet in accordance with the invention.

A plot of the field strength versus distance along the "Y" axis is shown in FIG. 11. Starting at the Y=0 point, which represents the edge of the magnet, and progressing to the right (increasing Y), the field magnitude increases to the maximum, then tapers in a controlled fashion, essentially producing a useful magnetic field in one dimension.

The invention simply adds Golay coils in orthogonal relationship to produce the useful magnetic field in two dimensions. The addition of permanent magnets to bolster the magnitude of the field allows for reduced size and strength of the nonhomogeneous bore magnet which in turn reduces power dissipation, weight, cost, and other factors.

Figure 12:
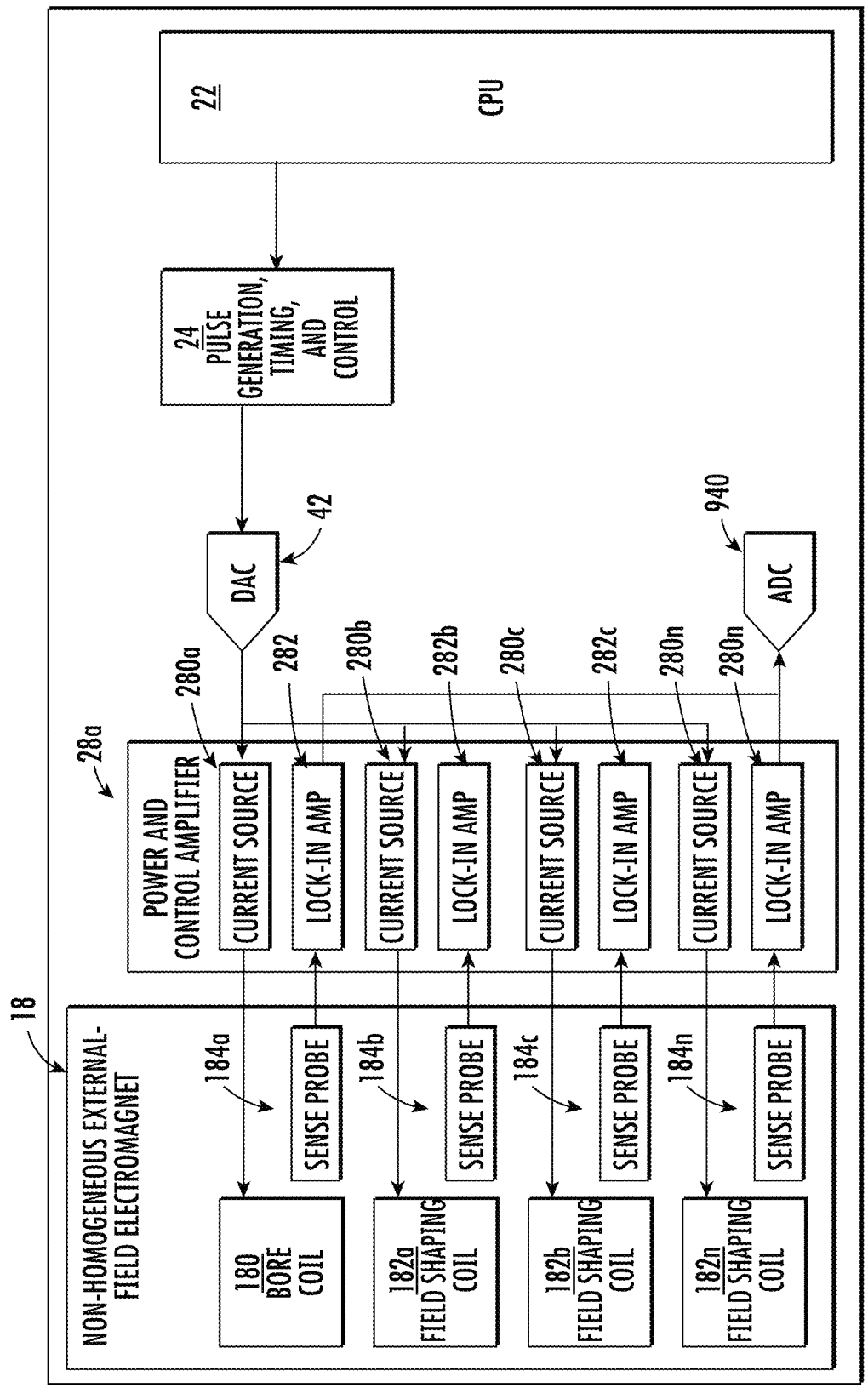
FIG. 12 is a block diagram of a system for driving a non homogeneous external field magnet in accordance with the invention.

As seen in FIG. 12, in a non limiting embodiment showing the use of the nonhomogeneous external field magnet 18, like numerals being used to identify like structure, similar manner to the Golay coils, a bore coil 180 and each field shaping coil (solenoid coil) 182a-182n will be driven by computer controlled current sources 280a-280n with feedback provided by individual sensor probes 184a-184n amplified by an associated lock in amp 382a-282n that allow the computer (CPU 22) to ensure the correct magnitude bore field is produced. This also allows for computer controlled temporal changes to the bore field. A block diagram of the pMRI magnetic field control system is shown in the FIG. 12.

Again, the operation of magnets 180a-182n are operated under the control of CPU 22 which provides control signals to control unit 24, which in turn provides inputs to respective current sources 280a-280d of power and control amplifier 28. the respective current out puts from power and control amplifier 28 drive respective magnets 180-182n of non homogeneous external field magnet 18. CPU 22 controls the current applied, in part, in response to outputs from associated sensor probes 184a-184n monitoring magnets 180, 182a-182n. They in effect form a feedback loop.

1.2.3 Scanning System

In general, the prior art MRI sets up a very uniform bore field and then sets of a precise linear gradient. This creates a well-known spatial field. Then, the precessing protons are energized, allowed to relax, and the emitted energy detected. This is performed in a linear fashion to match the linear arrangement of the field.

However, this is not necessary if the field configuration is known. Any shape field can then be scanned and the information extracted from the data. In order to do this, a "rubber band" mode scanning technique is applied where the scanning follows the field shape. As the field shape changes, whether linearly or in some other fashion, the scanning speeds and accelerations change to match.

This can be applied both physically and mathematically, or both, which significantly reduces "artifacts not only in an inhomogeneous field but in a spatial and time varying field.

Further, techniques involved in spread spectrum communications, where signals are purposefully spread in bandwidth to avoid signal detection, and even drop signal levels below noise thresholds, are to be employed in reverse to "extract" signals in the presence of noise. A major contributor to image inhomogeneity in medical MRI machines is the presence of eddy currents.

Figure 13:
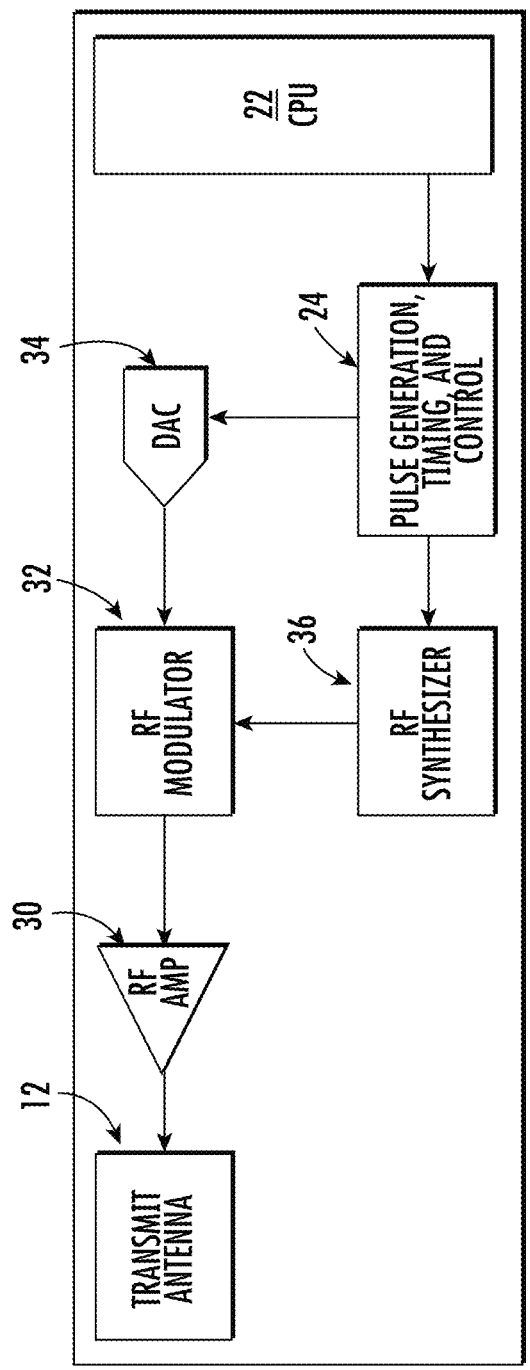
FIG. 13 is a block diagram of a transmit antenna system constructed in accordance with the invention.

A block diagram of the pMRI scanning system is shown in the FIG. 13. Like numerals are utilized to identify like structure as described throughout the specification.

1.2.4 Sensor System

The favored sensing technology for large medical MRIs is the Faraday Induction Coil. Faraday Induction Coils, which come in many shapes and sizes for various applications, are all essentially radio frequency antennas. See Young, S. W. (1988). *Magnetic resonance imaging* (p. 20). New York: Raven Press, Ltd. Once the bore field is applied to line up the precessing protons, and the gradient field is applied to create spatial differences in the sample, a set of specific pulse sequences is applied to the RF coils which transmit the RF energy into the precessing proton matrix and "perturb" them. When the precessing protons return to a naturally lower energy state, they "re-radiate" the energy in the form of an electromagnetic field that is measured typically by the same coils. It is this detected energy that is processed to form images of the underlying sample. Faraday induction coils are easily manipulated into efficient transmitters and receivers of radio frequency energy. However, they suffer from significant (as compared to other NMR sensors) noise and sensitivity issues, especially in fields less than 1T.

Figure 14:
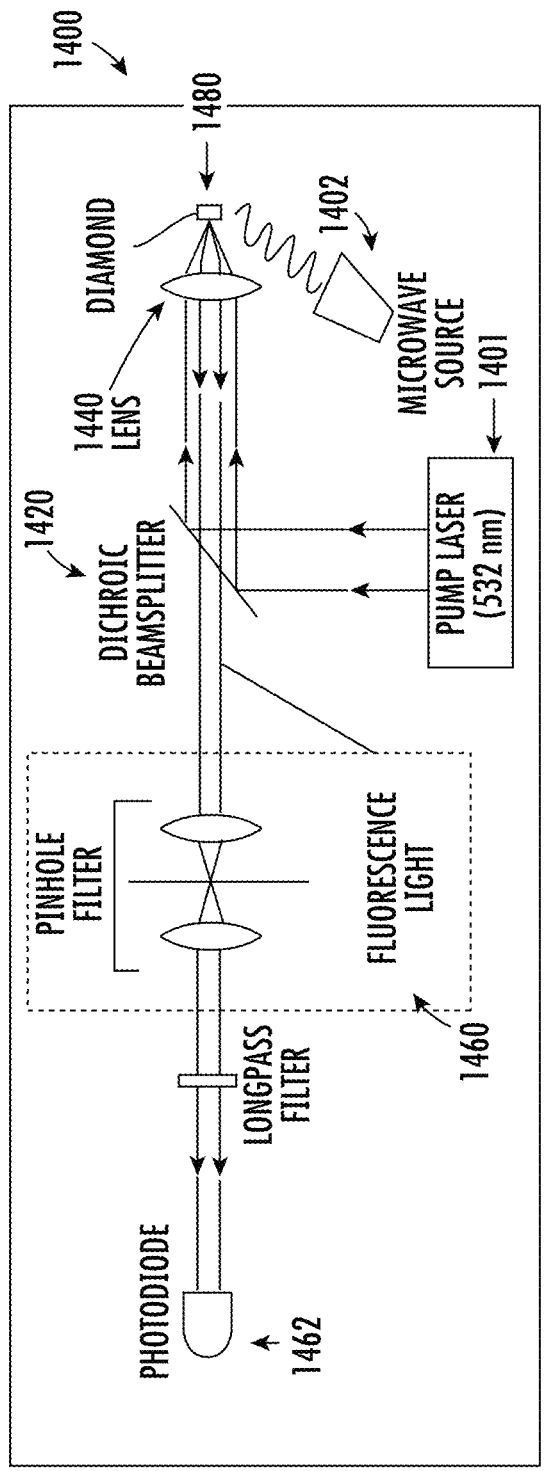
FIG. 14 is a block diagram of an NVD magnetometer constructed in accordance with the invention.

For the Portable Magnetic Resonance Imager, a new and novel application of the Nitrogen-Vacancy Diamond (NVD) magnetometer is applied. A typical NVD magnetometer notional layout is shown in FIG. 14. See Grosz, A., Ed. (2017). *High Sensitivity Magnetometers* (p559). Switzerland: Springer International Publishing.

As seen in FIG. 14, an NVD magnetometer 1400 includes a pump laser 1401, preferable in the green wavelength. Pump laser 1401 outputs a light beam to a dichroic beam splitter 1420 which directs the beam through a lens 1440 to be focused on NVD crystal 1480. A microwave source 1402 emits microwaves at NVD crystal 1480 which in response thereto, emits light through beam splitter 1420 and optics 1460 as known in the art to be received at photodiode 1462.

Figure 15:
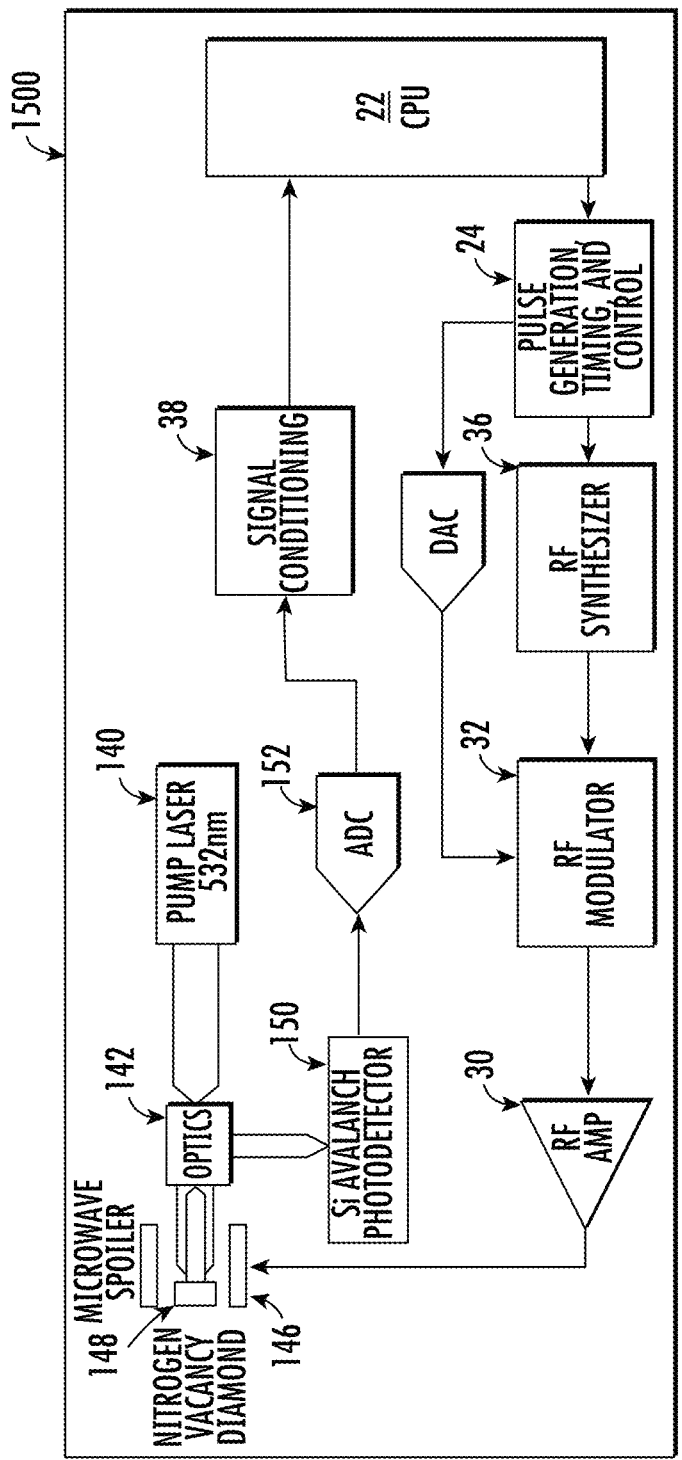
FIG. 15 is a block diagram of an NVD sensor system constructed in accordance with the invention.

FIG. 15 is a block diagram of the pMRI NVD sensor system 1500 constructed in accordance with the invention is provided; like numerals are utilized to indicate like structure. CPU 22 outputs control signals to pulse generator 24 to output signals Nitrogen vacancy diamond magnetometer 14. The control signals are modified RF synthesizer 36, RF modulator 32 and then amplified by RF amplifier 30 prior to input to magnetometer 14. Return signals from magnetometer 14 are input to CPU 22 after being processed by analog to digital converter 152 and signal conditioning unit 38.

NVD magnetometer 14 includes a pump laser 1140, emitting light at the 532 nm wavelength in a preferred non limiting embodiment. The light beam is operated upon by optics 142 to then be directed to NVD 148. A microwave spoiler 146 operates on NVD 148, causing NVD to emit a beam of light at a second wavelength diverted by optics 142 to a Si avalanche photodetector 150 which emits an output indicative of the light characteristics back to CPU 22 through signal conditioning unit 38.

In this way a 532 nm laser 1140, or any energy pump source in the 450 nm and 637 nm range (the absorption band of the NVD 148) is used to excite the NV color center. As the color center energy spontaneously fluoresces, the resulting signal is detected by a silicon avalanche photodetector 150, or other photodetector. Since the fluoresce frequency is dependent on the m=±1 sub-energy levels, which are manipulated by the external magnetic field through the Zeeman effect, along with the fact there are four possible orientations of the N-V alignment in the diamond atomic structure, there are then a total of eight possible fluorescence frequencies.

A microwave signal, swept across the frequency range of the eight possible fluorescence frequencies, will interfere with the fluorescence as the microwave frequency resonates with the sub-level energy, causing the signal to weaken or diminish. The resulting eight "dips" in the spectrum, along with knowledge of the crystal orientation of the diamond, allow the signal to be read and the computer to calculate the direction and magnitude of the magnetic signal produced by the decaying precessing protons. As a result, an image of this data can be produced that provides the diagnostician a representative image of the underlying biological tissue or the magnetic resonant substance being measured.

1.2.4.1 Optically Detected Magnetic Resonance with NVD

Figure 16:
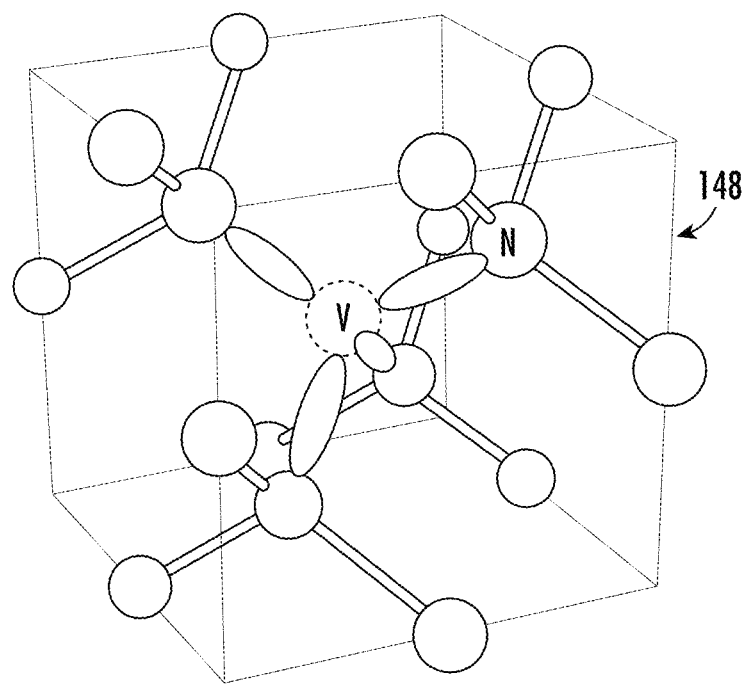
FIG. 16 is a diagram of the NVD crystal structure.

The NVD crystal structure, as shown FIG. 16, consists of a tetrahedral diamond lattice with one carbon atom substituted by a nitrogen atom. Adjacent to the nitrogen atom is a vacancy or "hole" in the crystal lattice. The tetrahedral structure allows four different orientations of the N-V alignment.

Each of the three carbon atoms adjacent to the NV center contributes a dangling electron. The nitrogen atom contributes two electrons, and a sixth electron completes the negative charge state NV$^-$, which is useful for magnetometry.

Figure 17:
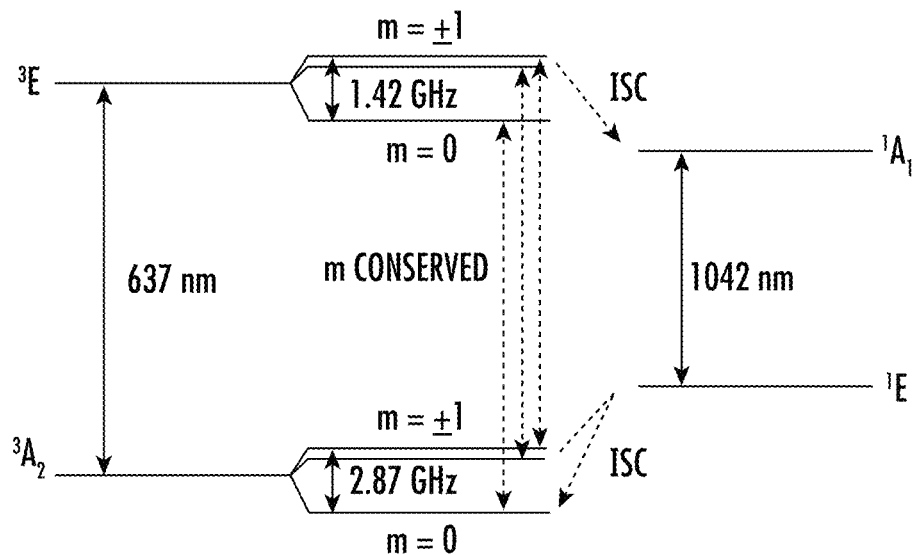
FIG. 17 is a diagram of an NV center electronic energy levels.
Figure 18:
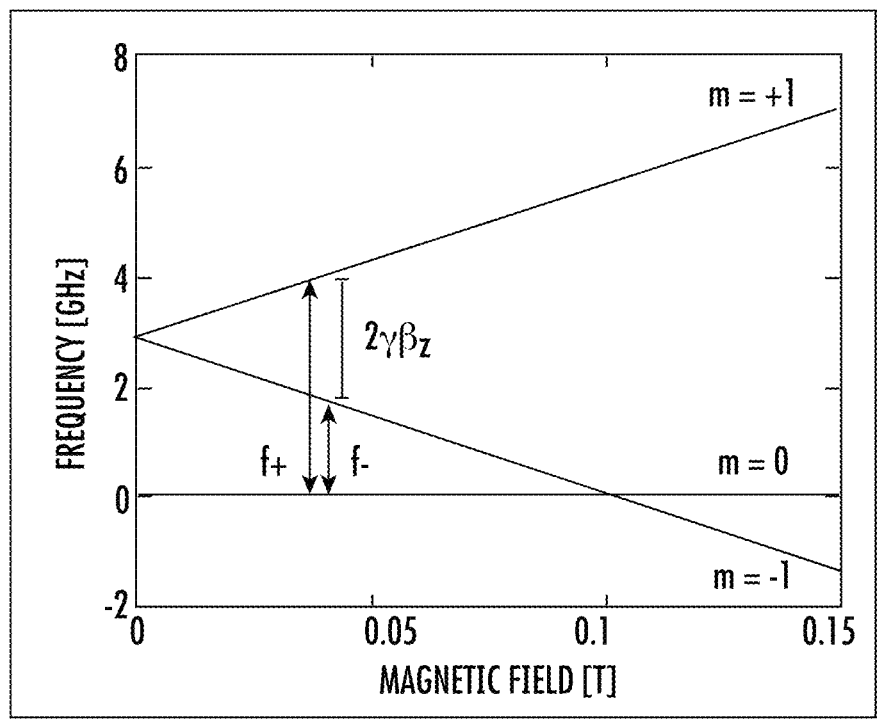
FIG. 18 is a diagram of the optically detected magnetic resonance in accordance with the invention.

The energy level structure of the NV$^-$ ("NV") center is shown in FIG. 16. The energy transition between the $^3A_2$ ground state and the $^3E$ energized state corresponds to 637 nm red light. See FIG. 17. But, because the phonon (collective excitation of the atoms) sidebands broaden the NV absorption and fluorescence spectra by hundreds of nanometers in wavelength, a readily available 532 nm green laser can be used to excite the NV center.

The spin-triplet state $^3A_2$ is of particular importance as magnetic fields couple to the NV center through the Zeeman effect. See Grosz, A., Ed. (2017). *High Sensitivity Magnetometers*. (p556). Switzerland: Springer International Publishing. If the NV center is exposed to a magnetic field, the energies of the sublevels depend linearly on the magnitude of the magnetic field. A detailed explanation of the electronic structure and behavior under optical excitation can be found in Doherty, M. W., Manson, N. B., Delaney, P., Jelezko, F., Wrachtrup, J., & Hollenberg, L. C. L. (2013). *The nitrogen-vacancy colour center in diamond*. arXiv: 1302.3288

Figure 19:
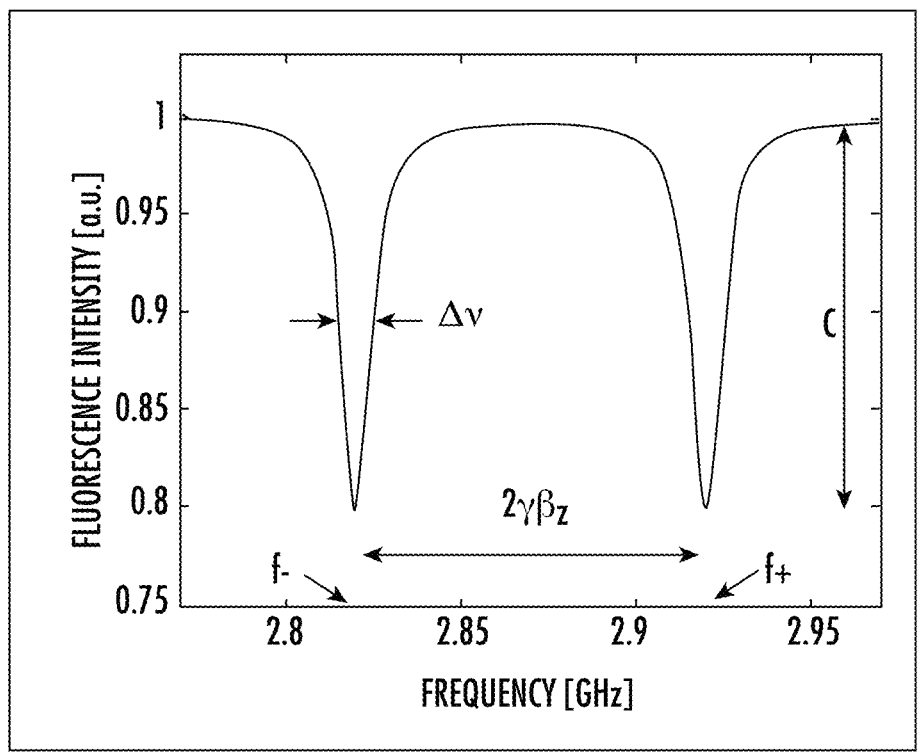
FIG. 19 is a diagram of the optically detected magnetic resonance spectrum in accordance with the invention.

Simultaneously with pumping, the NVD is swept with low power microwave (MW) radiation across the resonant frequencies. When the frequency of the MW is resonant with one of the m=±1 sublevels, it "spoils" the optical pumping action for that level. Thus, the fluorescence diminishes at that frequency. The magnitude of the magnetic field can be determined by measuring the difference between the m=±1 sublevels, indicated by the frequencies $f-$ and $f+$ on the diagram shown in FIG. 19. See Grosz, A., Ed. (2017). *High Sensitivity Magnetometers*. (p562). Switzerland: Springer International Publishing 1.2.4.1.1 Nitrogen Vacancy Diamond For the pMRI, we want as much pump power to be absorbed by the diamond as possible. This creates a high energy level within the crystal structure and increases the possibility of radiative decay or fluorescence, which can be detected optically as a function of the magnetic field. But, because diamond has a high index of refraction, the total internal reflection is small, resulting in pump light energy exiting the diamond quickly.

Figure 20:
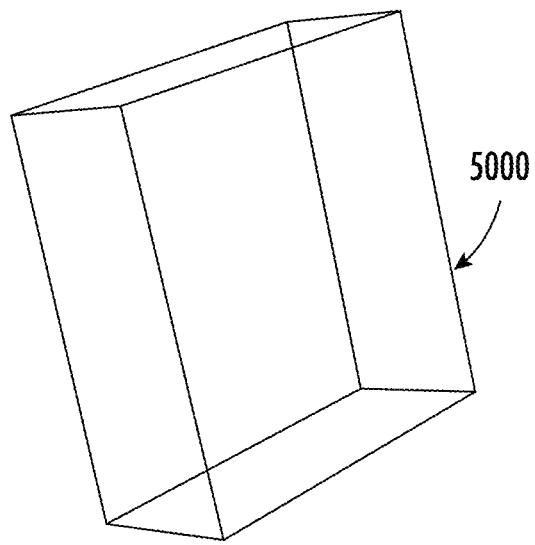
FIG. 20 is a perspective view of a cubical NVD as used in accordance with the invention.

For most NVD magnetometers, the diamond sensor element is a simple cube 5000, as shown in FIG. 20. Pump energy in the form of laser light enters the diamond, raises the energy level of a small fraction of the color centers, and whatever light was not absorbed exits the diamond.

Figure 21:
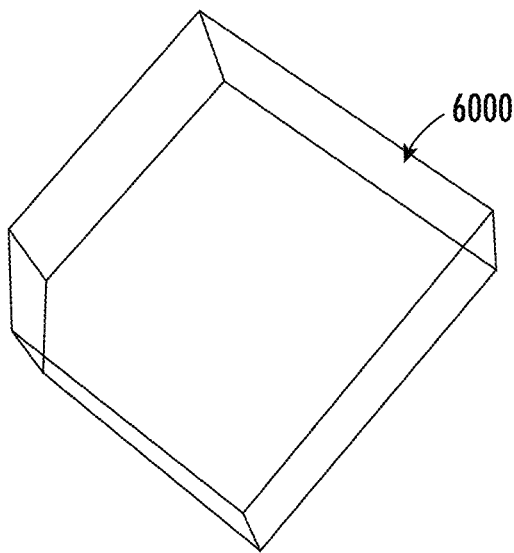
FIG. 21 is a perspective view of a cubical NVD with internal retro reflection as used in accordance with another embodiment of the invention.

To increase the probability of absorption, the total internal reflection is increased by creating an internal retro-reflection in a cube 6000, as shown in FIG. 21.

Figure 22:
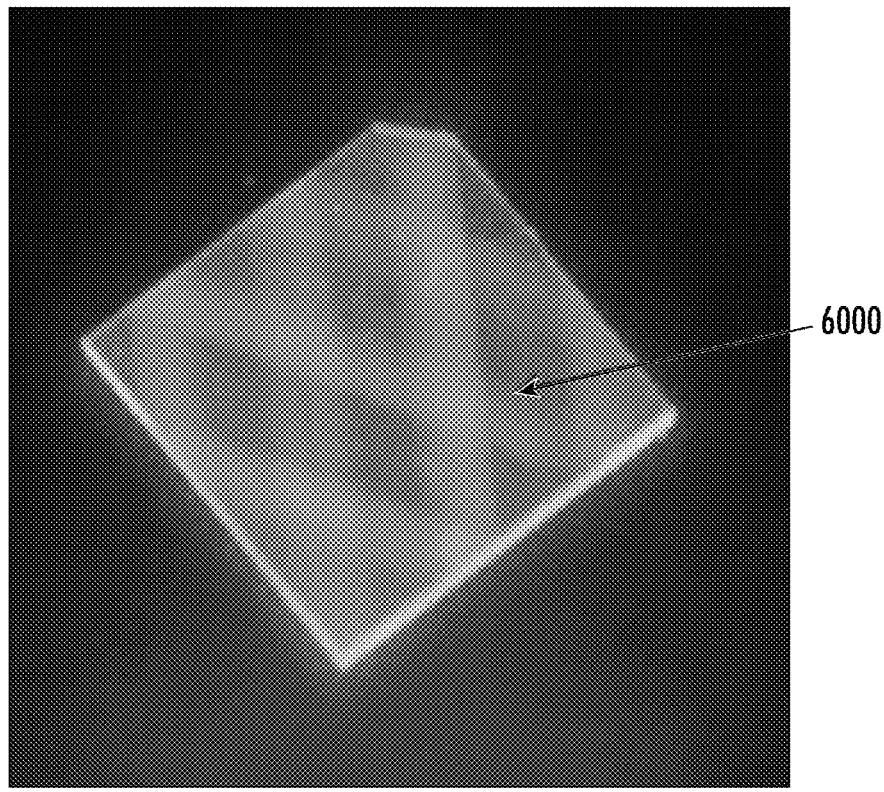
FIG. 22 is a perspective view of a cubical NVD showing internal reflection as exhibited by the NVD in accordance with yet another embodiment of the invention.

An image of an internal reflection of cube 6000 is shown in FIG. 22. Note the several light paths, but a large portion of the diamond is not illuminated. Every color center that is not illuminated reduces the overall sensitivity of the NVD.

Figure 23:
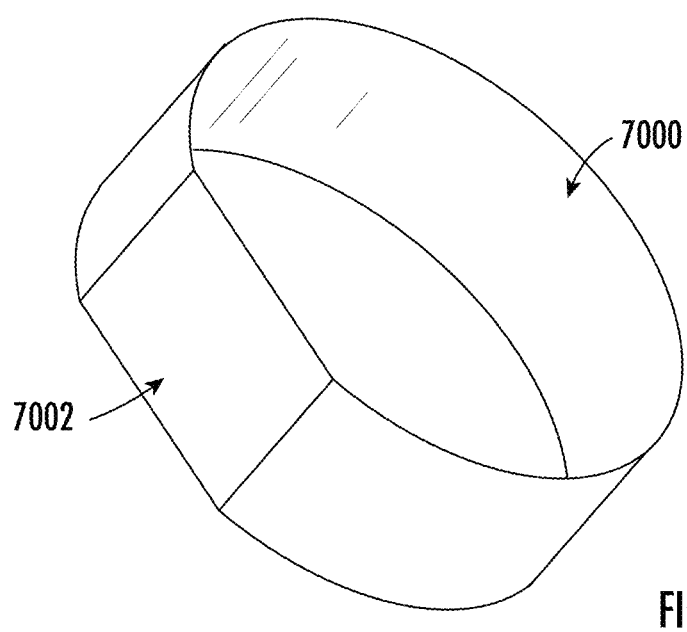
FIG. 23 is a perspective view of a cylindrical NVD as used in accordance with a further embodiment of the invention.

To increase the probability of illumination, a cylindrical NVD 7000 is envisioned, utilizing the index of refraction to reflect pump radiation throughout the NVD volume, and coating the external surfaces, except for the aperture 7002, to increase the amount of pump radiation absorbed. The invention is shown in FIG. 23.

Here pump energy enters the aperture and is reflected internally until absorbed. An external reflective coating is applied to increase this probability, with the aperture filtered to allow only fluorescence to escape.

Figure 24:
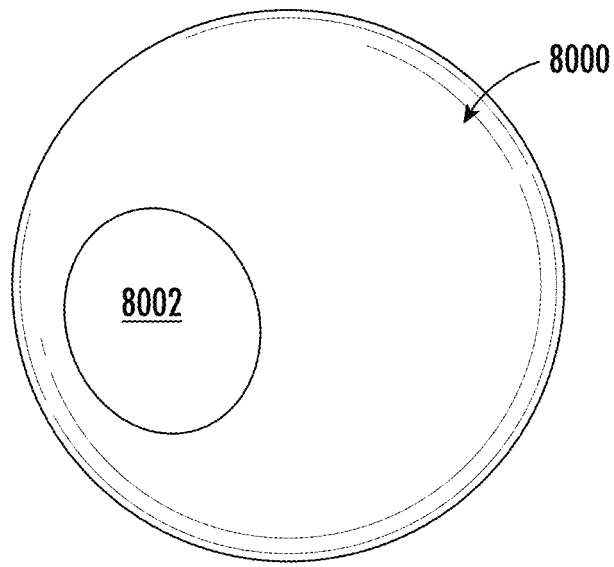
FIG. 24 is a perspective view of a spherical NVD as used in accordance with a further embodiment of the invention.

Further, an NVD 8000 within an aperture 8002 can be spherical, to maximize the total internal reflection as shown in the embodiment of FIG. 24.

1.2.4.1.1.1 NVD Atomic Structure

Two forms of NVD atomic structure are known. The neutral NV$^0$ and a negatively charged NV$^-$ have significantly different optical and spin characteristics. The negatively charged NV$^-$ state is applied to this technology.

Further, the sensitivity of the NVD is enhanced by utilizing $^{12}C$ carbon isotopes, with $^{13}C$ isotopes below 0.01%.

1.2.4.1.1.2 NVD Crystalline Orientation

The NVD is sensitive to magnetic fields along the N-V axis. As a tetrahedral crystalline structure, there are four possible N-V orientations. Any one N-V axis will have maximum sensitivity when the B field line is coincident to the N-V axis. The other three N-V axes will detect a fraction of the B field. Therefore, orientation of one N-V axis is preferred parallel to the probe axis.

1.2.4.1.2 Plurality of NVD Sensors

Due to the directionality of the NVD sensor, along the N-V axis, mathematical calculations of the B field direction can be calculated based on the intensity along each N-V axis. However, with maximum sensitivity when the N-V axis is aligned with the B field, a secondary, tertiary, and a plurality of NVD sensors can be used in parallax mode to identify the B field direction, and thus pinpoint the source of the magnetic field.

As a result, the MRI image field can be electronically scanned by adjusting the bias magnet for each sensor and "reading" each voxel in a bulk fashion. Since this can be performed very quickly, three-dimensional video images of the concentration of proton spins for each voxel can be calculated and display at video image speed.

1.2.4.2 Bias Magnet
1.2.4.2.1 Shimmed Helmholtz Coils

Figure 25:
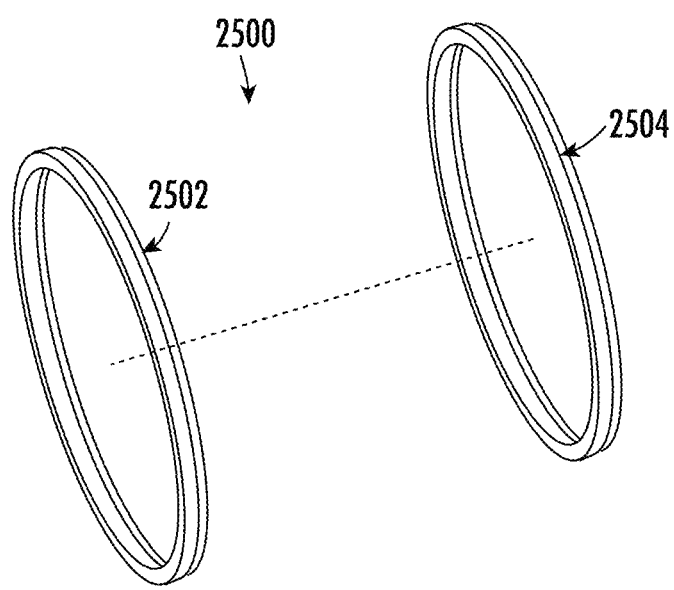
FIG. 25 is a perspective view of magnets for biasing a sensor in accordance with the invention.

As seen in FIG. 25, Helmholtz coils 2500 consist of two coaxial electromagnets 2502, 2504. Together, they can be used to create a very uniform magnetic field between the coils. However, that field uniformity can be improved by adding additional shim coils, also in the coaxial configuration.

To minimize coil size and power dissipation, each shimmed Helmholtz coil can be supplemented with permanent magnets arranged coaxially at the extents of the coil configuration.

Shimmed Helmholtz coils are positioned around the NVD to perform magnetic biasing and can also be modulated to cancel external, unwanted, magnetic fields, thereby increasing the sensitivity of the magnetic field of interest.

1.2.4.2.2 Orthogonal Helmholtz Coils

Figure 26:
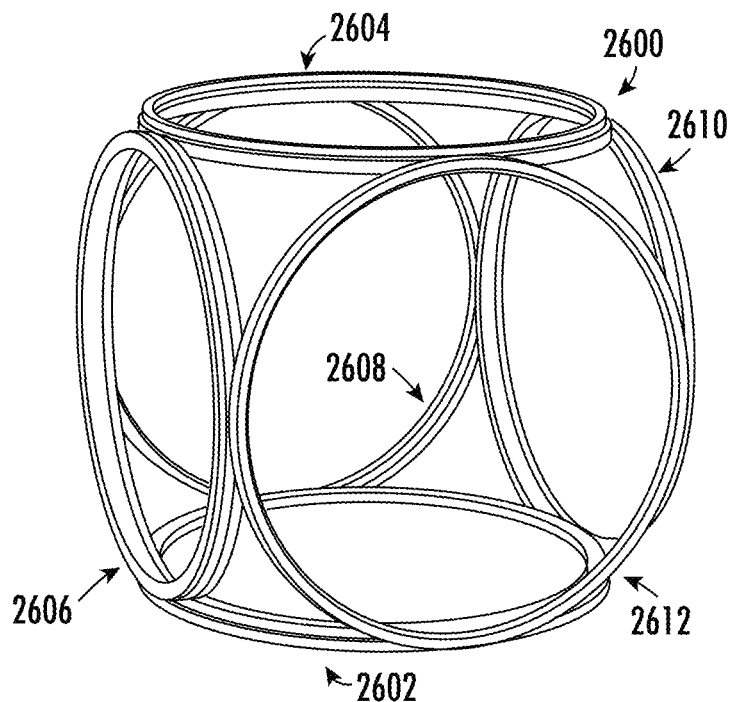
FIG. 26 is a perspective view of magnets for biasing a sensor in accordance with another embodiment of the invention.

In the instant pMRI it is desired to measure the magnetic field in not only spatial but temporal coordinates. Because the field will be different at various times and spatial coordinates, the magnetic field may need biasing or cancelling in various directions. Corresponding to the Cartesian coordinate system, an Orthogonally arranged set 2600 of shimmed Helmholtz coils 2602-2612 is placed around the NVD sensor (not shown) in FIG. 26. In this manner, the coils, under computer control, can be dynamically modulated to apply the appropriate biasing and cancelling functions.

1.2.4.2.3 Tetrahedral Helmholtz Coil Assembly

Figure 27:
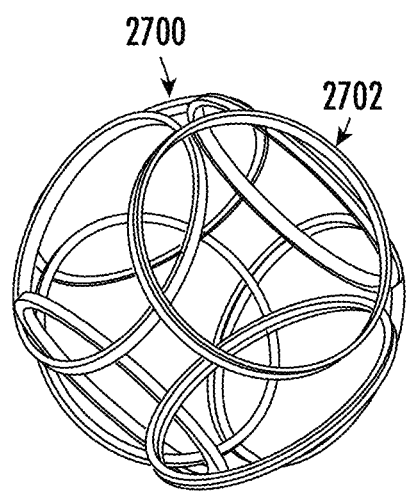
FIG. 27 is a perspective view of magnets for biasing a sensor in accordance with yet another embodiment of the invention.

In another embodiment of the Helmholtz coil assembly, as shown in FIG. 27, a set of four shimmed Helmholtz coils 2700 and 27002 can be arranged in a tetrahedral fashion, aligned with the N-V axes of the NVD sensor not shown, to directly influence the sensitivity of the N-V color center in a linear fashion.

In all configurations, permanent magnets can supplement the field.

1.2.4.3 Microwave Spoiler

When the NVD 148 is pumped using 532 nm green laser light, or in other embodiments, one of several wavelengths in the absorption bands, the fluorescence is a function of the magnetic field. Each of the energy sublevels will have a specific frequency, and as a result of four diamond axes, a total of eight frequencies that represent the magnitude of the magnetic field along one of the four axes.

Scanning the diamond with microwave energy, when the frequency is resonant with one of the energy sublevels, will diminish the fluorescence, creating a "dip" in the spectrum at the resonant frequencies.

Figure 28:
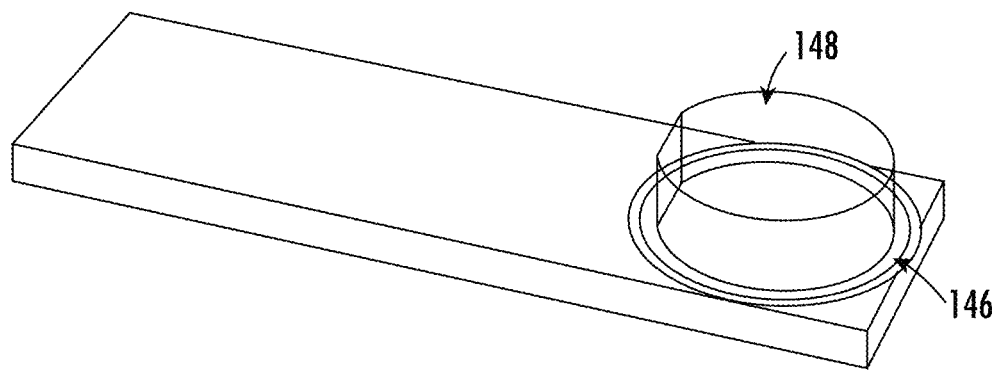
FIG. 28 is perspective view a microwave spoiler structure in accordance with the invention.

In order to maximize contrast, as shown in FIG. 28, the NVD 148 must be scanned by microwave spoiler 146 with a uniform microwave field. in one nonlimiting embodiment microwave spoiler 146 is a micro-machined, or vapor deposited microwave antenna, formed to create a uniform microwave field through the NVD 148 described above.

The microwave spoiler 146 is impedance matched to the base material such that minimal losses and spurious transmissions occur.

1.2.4.4 Pump Laser

Figure 29:
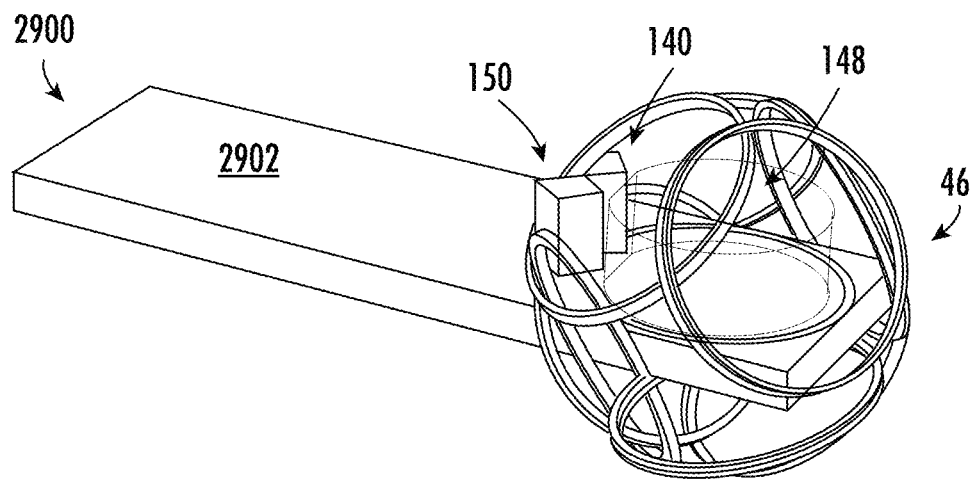
FIG. 29 a perspective view of an NVD sensor assembly constructed in accordance with the invention.

Reference is now made to FIG. 29, where an embodiment of the NVD sensor assembly 2900 constructed in accordance with the invention. A substrate 2902 supports an NVD 148. A laser diode 1140, acting as an energy source of the NVD 148 may be any of a number of optical energy sources, with such wavelengths between 450 nm and 637 nm, with 532 nm being preferred due to the ease of manufacture. microwave spoiler 146 is formed about NVD 148. Photodetector 150 in the form of a photodiode, is disposed on substrate 2902 adjacent to NVD 148, the light path. A tetrahedral Helmholtz coil 2700 is disposed about NVD 148.

Solid state laser diodes within this wavelength band pump energy into the NVD, causing it to fluoresce. The laser light is focus and dispersed evenly with a purpose-built prismatic interface, with appropriate filters and reflective coatings designed to transfer the maximum amount of laser light into the diamond.

Alternatively, external laser light sources can be directed to illuminate the NVD through fiber optic guides, various optical elements, and conditioned with appropriate filters and reflective coatings.

Another embodiment has the NVD surrounded with laser diodes or optical elements to maximize illumination and evenly disperse pump energy through the bulk of the NVD.

Similarly, fluorescence detecting elements, such as silicon avalanche photodiodes can be placed such that the prismatic entrance optics to the NVD transmit the fluorescence, but reflect pump energy.

A Portable Magnetic Resonance Imager (pMRI) constructed as described above combines improved nonhomogeneous low-field bore magnets with Optically Detected Quantum Magnetometry using Nitrogen Vacancy Diamonds (NVD) to produce a system capable of producing diagnostic quality images at video speeds.

It should be noted that although as described above, it is a preferred embodiment to detect Hydrogen, the portable magnetic resonance imager constructed in accordance with the present invention will detect isotopes that have nonzero magnetic spin.

All directional references (e.g. top, bottom, front, back) are only used for identification purposes to aid the reader's understanding of the embodiments of the present invention, and do not create limitations, particularly as to the position, orientation, or use of the invention unless specifically set forth in the claims. Joinder references (e.g. attached, coupled, connected, and the like) are to be construed broadly and may include intermediate members between a connection of elements and relative movement between elements. As such, joinder references do not necessarily infer that two elements are directly connected and in fixed relation to each other.

The above-described benefits, embodiments, and/or characterizations are not necessarily complete or exhaustive, and in particular, as to the patentable subject matter disclosed herein. Other benefits, embodiments, and/or characterizations of the present invention are possible utilizing, alone or in combination, as set forth above and/or described in the accompanying figures and/or in the description herein below.

The phrases "at least one," "one or more," and "and/or," as used herein, are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

Unless otherwise indicated, all numbers expressing quantities, dimensions, conditions, and so forth used in the specification and drawing figures are to be understood as being approximations which may be modified in all instances as required for a particular application of the novel assembly and method described herein.

The term "a" or "an" entity, as used herein, refers to one or more of that entity. As such, the terms "a" (or "an"), "one or more" and "at least one" can be used interchangeably herein.

The use of "including," "comprising," or "having" and variations thereof herein is meant to encompass the items listed thereafter and equivalents thereof as well as additional items. Accordingly, the terms "including," "comprising," or "having" and variations thereof can be used interchangeably herein.

It shall be understood that the term "means" as used herein shall be given its broadest possible interpretation in accordance with 35 U.S.C., Section 112(f). Accordingly, a claim incorporating the term "means" shall cover all structures, materials, or acts set forth herein, and all of the equivalents thereof. Further, the structures, materials, or acts and the equivalents thereof shall include all those described in the Summary, Brief Description of the Drawings, Detailed Description and in the appended drawing figures.

In methodologies directly or indirectly set forth herein, various steps and operations are described in one possible order of operation, but those skilled in the art will recognize that steps and operations may be rearranged, replaced, or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

It should be further recognized that the invention is not limited to the particular embodiments described above. Accordingly, numerous modifications can be made without departing from the spirit of the invention and scope of the claims appended hereto.

The invention claimed is:

1. A portable magnetic resonance imager comprising:
   a probe;
   two or more magnets, disposed in the probe, creating at least one magnetic field to precess protons at a target;
   a magnetometer disposed in the probe, the magnetometer having a light source, a nitrogen vacancy diamond, the light source projecting a light on the nitrogen vacancy diamond, the nitrogen vacancy diamond fluorescing in response to the light; and
   a photodetector detecting the fluorescence and producing a signal in response thereto indicative of the decaying of precessing protons having precessed in the presence of the two or more magnets.

2. The portable magnetic resonance imager of claim 1, wherein the two or more magnets includes a non homogeneous external field magnet and a permanent magnet, the non homogeneous external field magnet producing an aligned magnetic field and gradient magnetic fields.

3. The portable magnetic resonance imager of claim 1, wherein the magnetometer monitors a magnetic field of the target, at the target.

4. The portable magnetic resonance imager of claim 2, wherein the non homogeneous external field magnet includes at least one Golay coil.

5. The portable magnetic resonance imager of claim 4, wherein the non homogeneous external field magnet includes a second Golay coil in facing spaced relationship from the at least one Golay coil, a current flowing through the at least one coil flowing in a first direction, a current flowing through the second Golay coil in a second direction, the first direction being opposite the second direction.

6. The portable magnetic resonance imager of claim 4, wherein the non homogeneous external field magnet includes a second Golay coil, and further comprising a sensor probe operatively monitoring a respective Golay coil, at least one current source, each respective current source providing an input to a respective Golay coil to activate the respective Golay coil.

7. The portable magnetic resonance imager of claim 6, further comprising a central processing unit for controlling the operation of the non homogeneous external field magnet, the sensor probe outputting a signal as a function of monitoring the Golay coil, the central processing unit controlling operation of the non homogeneous external field magnet in response to the signal to control a magnetic field gradient produced by the probe.

8. The portable magnetic resonance imager of claim 2, wherein the non homogeneous external field magnet includes at least one Bore magnet and at least one field shaping coil.

9. The portable magnetic resonance imager of claim 1, wherein the light source is a green wavelength pump laser, and further comprising a microwave source emitting microwaves on the nitrogen vacancy diamond, the nitrogen vacancy diamond emitting light in response thereto, and a photodiode, the photodiode receiving the light.

10. The portable magnetic resonance imager of claim 1, wherein the nitrogen vacancy diamond is a cube, an aperture is formed on one surface of the cube.

11. The portable magnetic resonance imager of claim 10, wherein the cube has external surfaces, and the external surfaces, other than the external surface formed by the aperture are coated with a reflector.

12. The portable magnetic resonance imager of claim 1, further comprising at least two shimmed Helmholz coils disposed about the nitrogen vacancy diamond.

13. The portable magnetic resonance imager of claim 1, further comprising a microwave antenna disposed to create a uniform microwave field through the nitrogen vacancy diamond.

* * * * *